United States Patent
Takenaga et al.

(10) Patent No.: US 10,096,499 B2
(45) Date of Patent: Oct. 9, 2018

(54) SUBSTRATE PROCESSING METHOD, PROGRAM, CONTROL APPARATUS, FILM FORMING APPARATUS, AND SUBSTRATE PROCESSING SYSTEM

(71) Applicant: Tokyo Electron Limited, Tokyo (JP)

(72) Inventors: Yuichi Takenaga, Iwate (JP); Syuji Nozawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 707 days.

(21) Appl. No.: 14/264,384

(22) Filed: Apr. 29, 2014

(65) Prior Publication Data

US 2014/0335693 A1 Nov. 13, 2014

(30) Foreign Application Priority Data

May 9, 2013 (JP) .................................. 2013-099591

(51) Int. Cl.
| | |
|---|---|
| H01L 21/67 | (2006.01) |
| G06F 19/00 | (2018.01) |
| C23C 16/46 | (2006.01) |
| C23C 16/52 | (2006.01) |
| C23C 16/56 | (2006.01) |

(52) U.S. Cl.
CPC ........ H01L 21/67248 (2013.01); C23C 16/46 (2013.01); C23C 16/52 (2013.01); C23C 16/56 (2013.01); H01L 21/6708 (2013.01)

(58) Field of Classification Search
CPC .................................................. H01L 21/6708
USPC ........................................................ 700/207
See application file for complete search history.

(56) References Cited

U.S. PATENT DOCUMENTS

| | | | | |
|---|---|---|---|---|
| 5,605,600 A | * | 2/1997 | Muller | ................ H01L 21/3065 216/37 |
| 5,751,896 A | * | 5/1998 | Sandhu | ............. C23C 16/45565 219/411 |
| 5,891,807 A | * | 4/1999 | Muller | ................ H01L 21/3065 257/E21.218 |

(Continued)

FOREIGN PATENT DOCUMENTS

| | | |
|---|---|---|
| JP | 06-318551 A | 11/1994 |
| JP | 2002-141347 A | 5/2002 |
| JP | 2003-158160 A | 5/2003 |

OTHER PUBLICATIONS

Edgar et al., Automatic control in microelectronics manufacturing: Practices, challenges, and possibilities, Automatica, vol. 36, Issue 11, Nov. 2000, pp. 1567-1603, ISSN 0005-1098, http://dx.doi.org/10.1016/S0005-1098(00)00084-4. (http://www.sciencedirect.com/science/article/pii/S0005109800000844).*

*Primary Examiner* — James D. Rutten
(74) *Attorney, Agent, or Firm* — Abelman, Frayne & Schwab

(57) ABSTRACT

A substrate processing method of the present disclosure includes forming a film on a workpiece using a processing gas in a processing chamber with a setting temperature profile including increase or decrease of a temperature; and etching the film. An etching rate of the film in the etching depends on a film formation temperature in the forming. The setting temperature profile is determined based on a first temperature dependence of the etching rate in the etching on the film formation temperature, and a second temperature dependence of a film formation amount in the forming on the film formation temperature.

8 Claims, 7 Drawing Sheets

(56) References Cited

U.S. PATENT DOCUMENTS

| | | | | |
|---|---|---|---|---|
| 6,074,696 A * | 6/2000 | Sato | ................... | C23C 16/4584 216/59 |
| 6,566,632 B1 * | 5/2003 | Katata | ............... | H01L 21/67103 219/444.1 |
| 6,936,182 B2 * | 8/2005 | Rushford | ................ | C03C 15/00 216/26 |
| 2007/0231483 A1 * | 10/2007 | Nanba | ............... | H01L 21/31055 427/240 |
| 2008/0255683 A1 * | 10/2008 | Takahashi | .......... | G05D 23/1935 700/42 |
| 2009/0029486 A1 * | 1/2009 | Ueno | ...................... | C23C 16/46 438/5 |
| 2009/0233450 A1 * | 9/2009 | Sakao | ................. | H01L 21/3065 438/716 |
| 2013/0265690 A1 * | 10/2013 | Maeta | ................ | H01L 21/6831 361/234 |
| 2015/0132863 A1 * | 5/2015 | Oohashi | ............ | H01J 37/32082 438/5 |

* cited by examiner

SUBSTRATE PROCESSING METHOD, PROGRAM, CONTROL APPARATUS, FILM FORMING APPARATUS, AND SUBSTRATE PROCESSING SYSTEM

CROSS-REFERENCE TO RELATED APPLICATIONS

This application is based on and claims priority from Japanese Patent Application No. 2013-099591, filed on May 9, 2013 with the Japan Patent Office, the disclosures of which is incorporated herein in its entirety by reference.

TECHNICAL FIELD

The present disclosure relates to a substrate processing method, a program, a control apparatus, and a substrate processing system.

BACKGROUND

In manufacturing semiconductor devices, a substrate processing apparatus configured to process semiconductor wafers serving as workpieces, such as a vertical heat treatment apparatus, is used. A holder configured to hold a plurality of wafers in a shelf form is disposed in the vertical heat treatment apparatus, and a film is formed on the wafers by, for example, a chemical vapor deposition (CVD) processing and an oxidation processing.

When a wafer is processed in a substrate processing apparatus, an in-plane film thickness of the wafer after film formation may lack uniformity. Therefore, Japanese Patent Laid-Open No. Hei 6-318551 discloses a method of forming a film while changing a temperature in order to enhance uniformity of an in-plane film thickness of a wafer. When the film is formed while changing the temperature, the temperature distribution on the wafer may be controlled, thereby improving uniformity of film thickness distribution. That is, better thickness distribution is obtained when an appropriate setting temperature profile is used.

SUMMARY

According to an aspect, the present disclosure provides a substrate processing method including: forming a film on a workpiece using a processing gas in a processing chamber with a setting temperature profile including increase or decrease of a temperature; and etching the film, in which an etching rate of the film in the etching depends on a film formation temperature in the forming, and the setting temperature profile is determined based on a first temperature dependence of the etching rate in the etching on the film formation temperature, and a second temperature dependence of a film formation amount in the forming on the film formation temperature.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
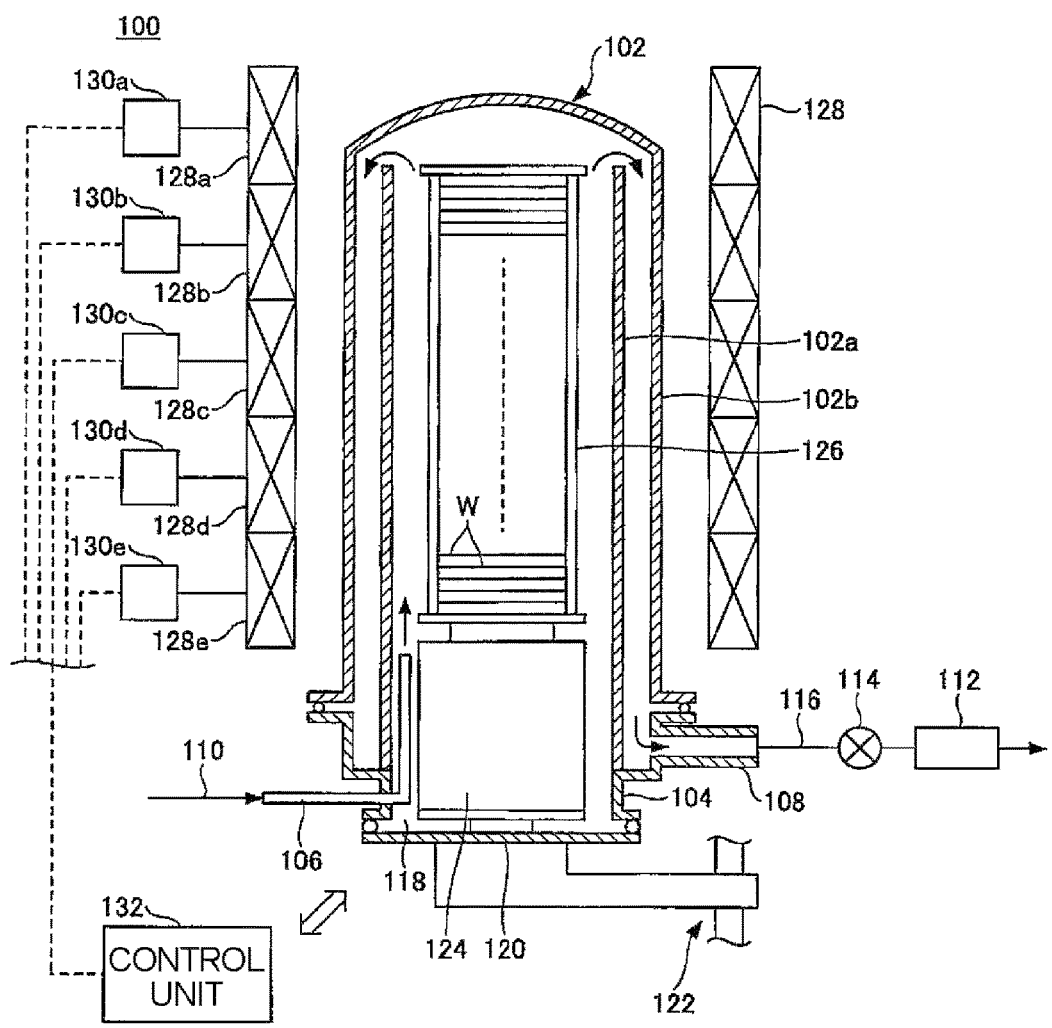
FIG. 1 is a schematic view illustrating an exemplary film forming apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

With a recent demand for high integration of semiconductor devices, it has been requested that a film thickness distribution be controlled more strictly.

In order to solve the problem, the present disclosure provides a substrate processing method which is capable of controlling a film thickness distribution.

According to an aspect, the present disclosure provides a substrate processing method including: forming a film on a workpiece using a processing gas in a processing chamber with a setting temperature profile including increase or decrease of a temperature; and etching the film, in which an etching rate of the film in the etching depends on a film formation temperature in the forming, and the setting temperature profile is determined based on a first temperature dependence of the etching rate in the etching on the film formation temperature, and a second temperature dependence of a film formation amount in the forming on the film formation temperature.

In the above-described substrate processing method, the setting temperature profile is determined with respect to the film formation amount and the etching rate that are predetermined based on a first process model, a second process model and a thermal model. The first process model expresses an influence of the film formation temperature on the film formation amount, the second process model expresses an influence of the film formation temperature on the etching rate, and the thermal model determines the setting temperature profile such that a temperature in the processing chamber is set to be the film formation temperature determined from the first process model and the second process model.

In the above-described substrate processing method, the setting temperature profile includes a setting temperature profile that changes a temperature from a first temperature to a second temperature at a first time.

According to another aspect, the present disclosure provides a computer-readable recording medium storing a program that, when executed, causes the computer to perform the substrate processing method as described above.

According to still aspect, the present disclosure provides a control apparatus of a film forming apparatus including a processing chamber and a heater, the control apparatus including: a model storage unit including a first process model, a second process model, and a thermal model. The control apparatus is configured to control the film forming apparatus to form a film on a workpiece with a setting temperature profile including increase or decrease of a temperature. The first process model expresses an influence of the film formation temperature on the film formation amount, the second process model expresses an influence of the film formation temperature on the etching rate, and the thermal model determines the setting temperature profile such that a temperature in the processing chamber is set to be the film formation temperature determined from the first process model and the second process model.

According to yet another aspect, the present disclosure provides a film forming apparatus including: a processing chamber; a heater; and a control unit equipped with a model storage unit configured to control the film forming apparatus to form a film on a workpiece with a setting temperature profile including increase or decrease of a temperature. The model storage unit includes a first process model, a second process model, and a thermal model. The first process model expresses an influence of the film formation temperature on the film formation amount, the second process model expresses an influence of the film formation temperature on the etching rate, and the thermal model determines the setting temperature profile such that a temperature in the processing chamber is set to be the film formation temperature determined from the first process model and the second process model.

According to still yet another aspect, the present disclosure provides a substrate processing system including: a film forming apparatus including a processing chamber and a heater and configured to form a film on a workpiece with a setting temperature profile including increase or decrease of a temperature; an etching apparatus configured to etch the film formed on the workpiece; and a control unit configured to control the film forming apparatus and the etching apparatus, in which the control unit determines the setting temperature profile based on a first temperature dependence of the etching rate in the etching on the film formation temperature, and a second temperature dependence of a film formation amount in the film forming on the film formation temperature.

In the above-mentioned substrate processing system, the control unit includes a the model storage unit that includes a first process model, a second process model, and a thermal model. The first process model expresses an influence of the film formation temperature on the film formation amount, the second process model expresses an influence of the film formation temperature on the etching rate, and the thermal model determines the setting temperature profile such that a temperature in the processing chamber is set to be the film formation temperature determined from the first process model and the second process model.

According to the present disclosure, it is possible to provide a substrate processing method which can control film thickness distribution.

Hereinafter, exemplary embodiments of the present disclosure will be described with reference to the drawings attached herewith.

(Substrate Processing System)

Description will be made on a substrate processing system which is capable of performing a substrate processing method according to an exemplary embodiment.

The substrate processing system according to the present exemplary embodiment includes a film forming apparatus which includes a processing chamber and a heater and is configured to form a film on a workpiece with a setting temperature profile including increase or decrease of a temperature, and an etching apparatus configured to etch the workpiece after film forming. The present exemplary embodiment will be described with respect to a case of using a semiconductor wafer W as a workpiece. However, the present disclosure is not limited thereto.

The substrate processing system includes a control unit configured to control the film forming apparatus and the etching apparatus. The control unit includes a central processing unit (CPU) and a storage unit. The CPU reads out a program stored in the storage unit and executes a substrate processing method to be described below according to the program. At this time, the CPU executes the substrate processing method according to the program in consideration of a film formation amount (film thickness) in a film forming process and an etching rate in an etching process after the film forming process. Accordingly, the in-plane distribution of the film thickness of the wafer W after etching may be uniform.

Further, in another aspect of the present exemplary embodiment, a film forming apparatus according to the present exemplary embodiment includes a processing chamber, a heater and a control unit, and is configured to form a film on a workpiece with a setting temperature profile including increase or decrease of a temperature. The control unit includes a CPU and a storage unit. The CPU reads out a program stored in the storage unit and executes a substrate processing method to be described below according to the program. At this time, as described below, the CPU executes a film forming method according to the program in consideration of, in advance, an etching rate in the subsequent etching process after the film forming process. Accordingly, when etching is subsequently performed by the etching apparatus, the in-plane distribution of the film thickness of the wafer W after etching may be uniform just by etching the film uniformly as in a case of etching a flat film.

Further, in still another aspect of the present exemplary embodiment, a control apparatus according to the present exemplary embodiment is configured to control operations of a film forming apparatus which includes a processing chamber and a heater and is configured to form a film on a workpiece with a setting temperature profile including increase or decrease of a temperature. The control apparatus includes a CPU and a storage unit. The CPU reads out a program stored in the storage unit and executes a substrate processing method to be described below according to the program. At this time, as described below, the CPU executes a film forming method according to the program in consideration of, in advance, an etching rate in the subsequent etching process after the film forming process. Accordingly, when etching is subsequently performed by the etching apparatus, the in-plane distribution of the film thickness of the wafer W after etching may be uniform just by etching the film uniformly as in a case of etching a flat film. Further, the control apparatus may control operations of the film forming apparatus by a wired or wireless communication means.

Description will be made on specific examples of configuration of the film forming apparatus and the etching apparatus in the substrate processing system according to the present exemplary embodiment.

[Film Forming Apparatus]

The film forming apparatus according to the present exemplary embodiment will be described. FIG. 1 is a schematic diagram illustrating an exemplary film forming apparatus according to the present exemplary embodiment.

The film forming apparatus 100 according to the present exemplary embodiment is provided with a processing chamber 102 made of, for example, quartz, in which the longitudinal direction of the processing chamber 102 is the vertical direction. For example, the processing chamber 102 is configured as a double pipe structure having a cylindrical inner tub 102a, and an outer tub 102b which is provided with a ceiling and disposed concentrically outside the inner tub 102a.

The lower portion of the processing chamber 102 is held hermetically by a manifold 104 made of stainless steel. The manifold 104 may be fixed to a base plate (not illustrate).

The manifold 104 is provided with a gas introduction unit 106 configured to introduce a processing gas or an inert gas (e.g., $N_2$ gas) into the processing chamber 102, and a gas exhaust unit 108 configured to exhaust the inside of the processing chamber 102. Although only one gas introduction unit 106 is illustrated in FIG. 1, the present disclosure is not limited thereto. Depending on the number of gas species used, a plurality of gas introduction units 106 may be provided.

The processing gas is not particularly limited, but may be appropriately selected by those skilled in the art, depending on the kind of films to be formed. In the etching process by an etching process to be described below, a silicon nitride film may be exemplified as a film in which the etching rate greatly depends on a temperature during the film formation. In this case, dichlorosilane gas and ammonia gas may be exemplified as process gases.

The gas introduction unit 106 is connected to a pipe 110 in order to introduce various gases as described above. Further, the pipe 110 is provided with a flow rate adjusting unit such as a mass flow controller (not illustrated) or a valve (not illustrated) in order to adjust each gas flow rate.

Further, the gas exhaust unit 108 is connected to a pipe 116 serving as a vacuum exhaust path. The pipe 116 is provided with, for example, a vacuum pump 112 or an opening variable valve 114 configured to controllably decompress the inside of the processing chamber 102.

A furnace throat 118 is formed in the lower portion of the manifold 104. The furnace throat 118 is provided with a disc-shaped cover 120 made of, for example, stainless steel. The cover 120 is movable up and down by an elevation mechanism 122 so as to seal the furnace throat 118.

A thermos 124 made of, for example, quartz is provided above the cover 120. In addition, above the thermos 124, a wafer W boat 126 made of, for example, quartz is disposed to hold, for example, about 25 to 150 sheets of wafers horizontally in multi-tiers at predetermined intervals.

The wafer W boat 126 is carried into the processing chamber 102 by moving up the cover 120 using the elevation mechanism 122. After the film forming processing, the wafer W boat 126 is carried out from the processing chamber 102 to a loading region below the processing chamber 102 by moving down the cover 120.

Further, a cylindrical heater 128 is installed around an outer periphery of the processing chamber 102 so as to heat the processing chamber 102 to a predetermined temperature.

The heater 128 is divided into a plurality of (e.g., five) zones (hereinafter, referred to as 'zone 1', 'zone 2', 'zone 3', 'zone 4' and 'zone 5' from the upper side in the vertical direction). The heaters 128a to 128e are configured to independently control a heat generation amount by power controllers 130a to 130e, respectively. Further, on the inner wall of the inner tub 102a and the outer wall of the outer tub 102b, temperature sensors (not illustrated) are provided to correspond to the heaters 128a to 128e.

The whole wafers W placed in the wafer W boat 126 constitute one batch and are subjected to a heat treatment at the same time. Further, at least one of wafers W placed in the wafer W boat 126 is preferably a monitor wafer W. The monitor wafer W may not be placed in each of the divided heaters 128. For example, ten or three sheets of monitor wafers W may be placed in the five zones.

Figure 2:
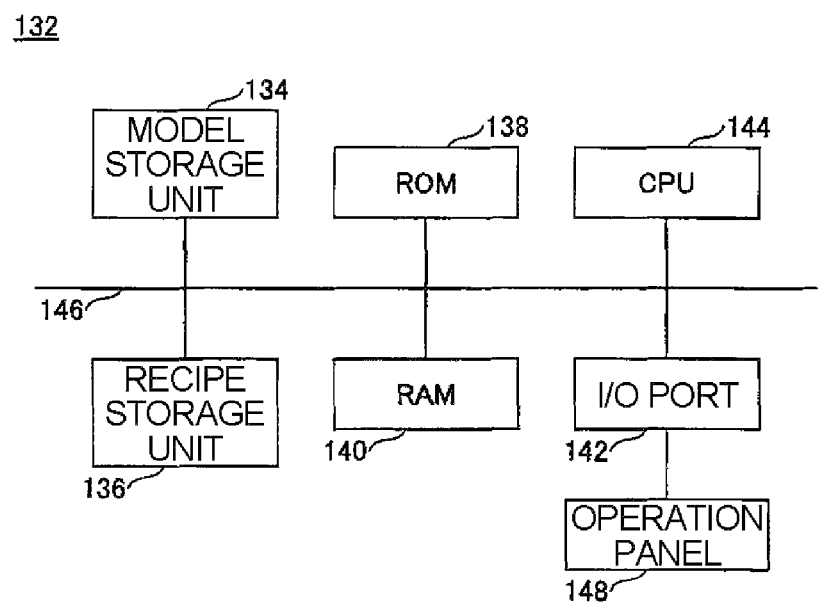
FIG. 2 is a schematic diagram illustrating an exemplary control unit according to the present exemplary embodiment.

Further, the film forming apparatus 100 according to the present exemplary embodiment includes a control unit 132. FIG. 2 is a schematic diagram illustrating an example of the control unit 132 according to the present exemplary embodiment.

As illustrated in FIG. 2, the control unit 132 includes a model storage unit 134, a recipe storage unit 136, a read-only memory (ROM) 138, a random access memory (RAM) 140, an I/O port 142, a CPU 144, and a bus 146 configured to connect these components to each other.

The model storage unit 134 stores two kinds of models: process models and thermal models. The stored process models may include (1) a wafer temperature-film thickness model configured to express an influence of a temperature of a wafer W (a film formation temperature) on a film thickness of a formed film (an amount of a film formed to the wafer W) and (2) a wafer temperature-etching rate model configured to express an influence of the temperature of the wafer W during film formation (a film formation temperature) on an etching rate of the formed film. The thermal models may include (3) a thermal model configured to determine a setting temperature profile such that a temperature in the processing chamber is set to be the film formation temperature determined from the wafer temperature-film thickness model and the wafer temperature-etching rate model. Besides, a thermal model configured to estimate the temperature of the wafer W from output of temperature sensors or the temperature of the monitor wafers W may be stored. Further, a detailed description of these models is omitted, but the models may be made appropriately by those skilled in the art.

The above-described models may also be considered about a case where the value of the default is not optimal depending on the process conditions or the state of the apparatus. Therefore, at least one of these models may be equipped with a learning function by adding an extended Kalman filter to a temperature calculating software such that learning of the models is performed.

The recipe storage unit 136 stores a process recipe that defines a control procedure depending on the kinds of the film forming processing performed in the film forming apparatus 100. The process recipe is a recipe prepared for every processing preformed in practice by a user, and defines, for example, a change in pressure, timing of start or stop of supplying gases such as processing gases, and supply amounts from the carry-in of the wafers W to the film forming apparatus 100 to the carry-out of the processed wafers W. Further, the recipe is updated based on the setting temperature profile determined from the process models and the thermal models as described above.

The ROM 138 is a storage medium that is constituted with, for example, an electrically erasable programmable read-only memory (EEPROM), a flash memory and a hard disc, and stores, for example, an operation program of the CPU 144.

The RAM 140 functions as a work area for the CPU 144.

The I/O port 142 supplies measurement signals for processing conditions, such as temperature, pressure and gas flow rates, to the CPU 144, and outputs control signals output by the CPU 144 to each unit (e.g., a controller (not illustrated) of the opening variable valve 114, the power controller 130, and a mass flow controller). Further, the I/O port 142 is connected with an operation panel 148 through which a user operates the film forming apparatus 100.

The CPU 144 executes the operation program stored in the ROM 138. According to the instructions from the operation panel 148, the CPU 144 controls the operations of the film forming apparatus 100 according to the process recipe stored in the recipe storage unit 136.

Further, the CPU 144 calculates the film forming temperature of the wafers W based on a desired film thickness (film formation amount) of the wafers W and a desired etching rate of the film after film formation determined based on the process recipe, and the process model stored in the model storage unit 134. The thermal model stored in the model storage unit 134 estimates the temperature of the wafers W from the output of the temperature sensor, and adjusts the temperature by outputting control signals to the power controller 130 such that the temperature of the wafers W becomes the calculated film formation temperature.

In calculating the temperature of the wafers W, an optimization algorithm, such as linear programming or quadratic programming, is used to calculate a temperature satisfying the in-plane uniformity based on the film thickness stored in the read process recipe and the etching rate in the subsequent etching process.

The bus 146 transmits information between the units.

[Etching Apparatus]

Figure 3:
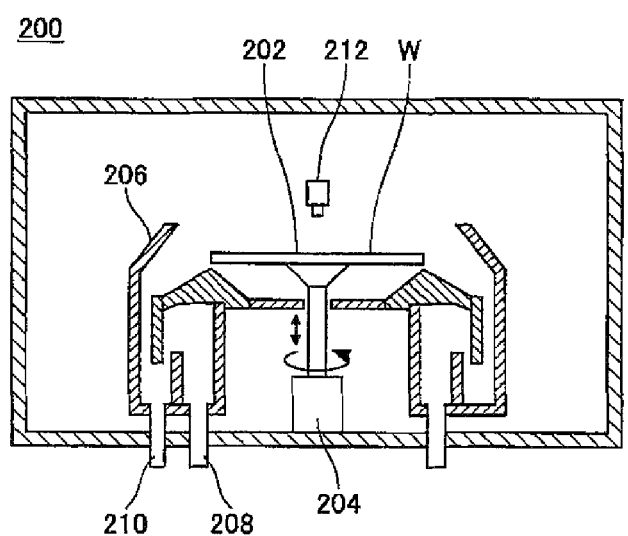
FIG. 3 is a schematic view illustrating an exemplary etching apparatus according to the present exemplary embodiment.
Figure 4:
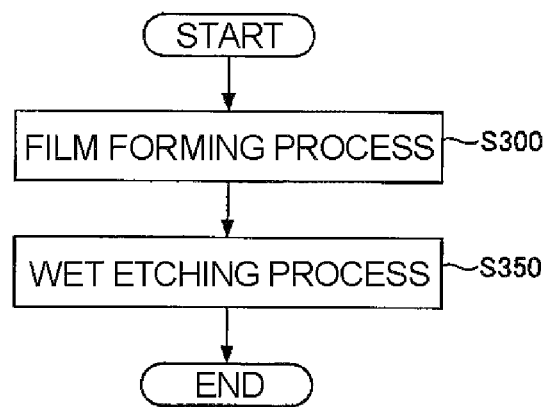
FIG. 4 is a flowchart illustrating a substrate processing method according to the present exemplary embodiment.

Next, the etching apparatus according to the present exemplary embodiment will be described. FIG. 3 is a schematic diagram illustrating an exemplary etching apparatus according to the present exemplary embodiment. Further, in the present exemplary embodiment, descriptions will be made on, as an example, a wet etching apparatus that wet-etches a wafer W on which a predetermined film is formed using the above-described film forming apparatus, but the present disclosure is not limited thereto. In a case of a process in which the etching rate of the film formed by the above-described film forming apparatus depends on the film formation temperature during the film formation, a dry etching apparatus dry-etching the wafers W may be used.

The etching apparatus 200 illustrated in FIG. 3 is provided with a holding unit 202, such as a rotary stage, configured to hold a wafer W. The holding unit 202 is, for example, a spin chuck, and is configured to hold a wafer W by vacuum suction.

The holding unit 202 is configured to be rotatable around a vertical axis and movable up and down by a driving unit 204. While spinning the wafer W at a predetermined rotational speed by the driving unit 204, an etching liquid is injected to the wafer W at a predetermined flow rate by a nozzle 212 to be described below. At that time, the nozzle 212 may be pivoted or swung, or the nozzle 212 may reciprocate in a radial direction of the wafer W.

Further, around the holding unit 202, a cup 206 extending over the wafer W and the holding unit 202 is provided. On the bottom surface of the cup 206, waste liquid units such as an exhaust pipe 208 and a drain pipe 210 are provided. Gases or melts generated due to the reaction on the wafer W are scattered around the holding unit 202 and guided to the bottom surface of the cup 206, and the waste liquid is sent from the drain pipe 210 to a drain tank (not illustrated). Further, the exhaust gas is sent from the exhaust pipe 208 to an exhaust apparatus (not illustrated).

(Substrate Processing Method)

Next, descriptions will be made on a substrate processing method according to the present exemplary embodiment, using the film forming apparatus and the etching apparatus configured as described above.

The substrate processing method according to the present exemplary embodiment includes a film forming process 5300 of forming a film on a substrate using a processing gas with a setting temperature profile including increase or decrease of a temperature, and an etching process 5350 of etching the film. The etching process etches the film in which an etching rate depends on a film formation temperature in the film forming process. The setting temperature profile is determined based on a first temperature dependence of the etching rate in the etching process on the film formation temperature, and a second temperature dependence of a film formation amount in the film forming processing on the film formation temperature.

[Conventional Substrate Processing Method]

Figure 5D:
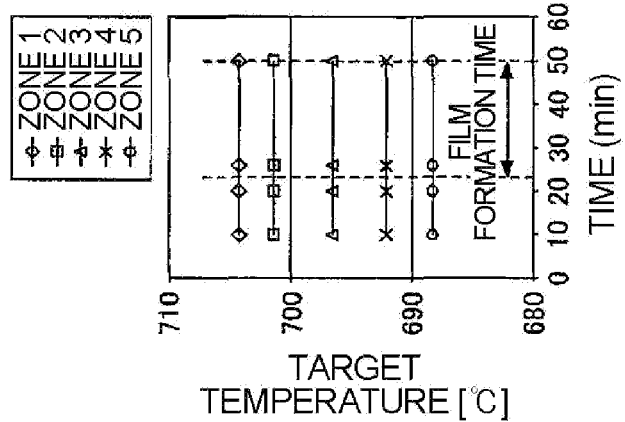
FIGS. 5A to 5D are schematic views for describing a conventional substrate processing method.
Figure 5C:
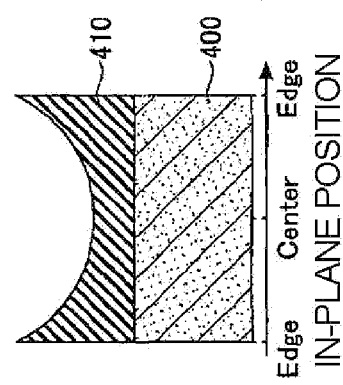
Figure 5B:
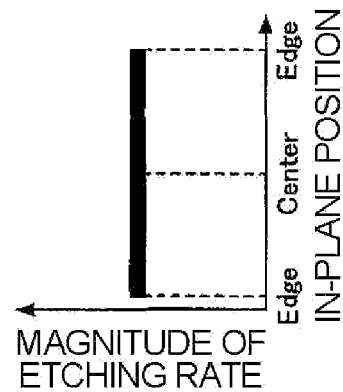
Figure 5A:
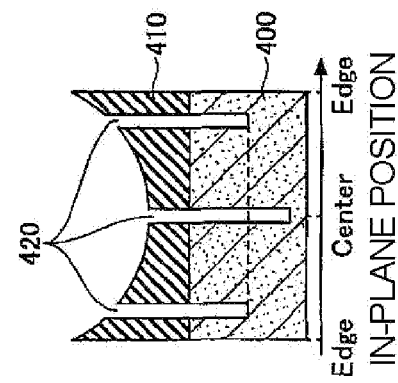

FIGS. 5A to 5D are schematic views for describing a conventional substrate processing method. More specifically, FIG. 5A illustrates a relationship between the lapse of time (horizontal axis) and the setting temperature (vertical axis). FIG. 5B is a schematic view for describing the film forming state of a wafer W in a case where the wafer W is subjected to a film formation processing with the setting temperature profile illustrated in FIG. 5A, and the horizontal axis denotes a position of the wafer W. FIG. 5C is a schematic view for describing an in-plane etching rate of the wafer W in a case where the wafer W is subjected to the film formation processing with the setting temperature profile illustrated in FIG. 5A. In FIG. 5C, the horizontal axis denotes a position of the wafer W, and the vertical axis denotes a magnitude of the etching rate. FIG. 5D is a schematic view for describing an example of a wafer state after etching, and the horizontal axis denotes a position of the wafer W.

Figures 6A, 6B, 6C, 6D:
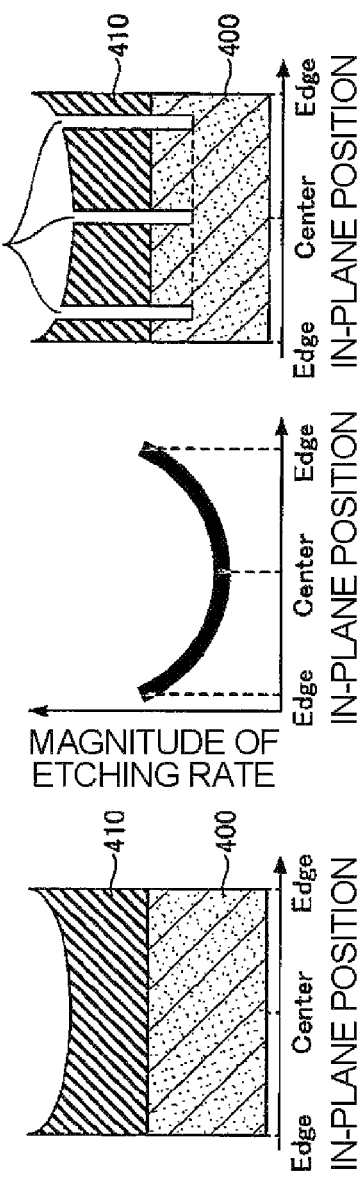
FIGS. 6A to 6D are schematic views for describing an exemplary substrate processing method according to the present exemplary embodiment.

Further, in the present exemplary embodiment, descriptions will be made on, for example, a case where a target film 410 is formed on a base 400 serving as a wafer W, as illustrated in FIG. 5B and FIG. 6B to be described below. The film 410 is a film in which an etching rate is varied depending on a film formation temperature in the film forming process.

As illustrated in FIG. 5A, wafers W have been subjected to a film forming processing such that the setting temperatures in zone 1 to zone 5 are constant but different from each other. The reason why the setting temperatures in zone 1 to zone 5 are different from each other is to facilitate the uniformity of the film thickness between wafers W, that is, to enhance the in-plane uniformity of the wafers W.

In this case, as illustrated in FIG. 5B, as for the film thickness distribution of the film 410, the film thickness in a center portion becomes smaller than the film thickness in an edge portion. That is, the film 410 is formed such that the center portion becomes concave with respect to the edge portion. The reason why the film thickness distribution is different between the center portion and the edge portion is that the film thickness distribution depends on the film formation temperature, as well as the concentration distribution of a processing gas in a plane of the wafer W.

Here, as described above, the film 410 is varied depending on the film formation temperature. Therefore, in a film forming processing at the fixed temperatures expressed by the setting temperature profiles in FIG. 5A, the in-plane etching rate of the wafer W becomes constant as illustrated in FIG. 5C.

As a result, in the wafer W after etching, as illustrated in FIG. 5D, the depths of etched portions 420 (heights from the bottom surface of the base 400 in the bottom surfaces of the etched portions 420) become different in the center portion and the edge portions. That is, in the conventional substrate processing method, the in-plane film thickness distribution after etching the base 400 becomes ununiform.

[Substrate Processing Method According to Present Exemplary Embodiment]

FIGS. 6A to 6D are schematic views for describing an exemplary substrate processing method according to the present exemplary embodiment. More specifically, FIG. 6A illustrates a relationship between the lapse of time and the setting temperature. FIG. 6B is a schematic view for describing the film forming state of a wafer W in a case where the wafer W is subjected to a film formation processing with the setting temperature profile illustrated in FIG. 6A. FIG. 6C is a schematic view for describing an in-plane etching rate of the wafer W in a case where the wafer W is subjected to a film formation processing with the setting temperature profile illustrated in FIG. 6A. FIG. 6D is a schematic view for describing an example of a wafer state after etching.

As illustrated in FIG. 6A, a wafer W has been subjected to a film forming processing such that the setting temperatures in zone 1 to zone 5 are changed during the film formation and different from each other. Further, in the example as illustrated in FIG. 6A, although descriptions are made on a process in which the setting temperatures are decreased over time, the present disclosure is not limited to this exemplary embodiment and may also include a process in which the setting temperatures are increased over time.

In the center portion and the edge portion of the wafer W, the degrees of temperature change with respect to the setting temperature are different from each other. Specifically, since the edge portion of the wafer W is close to the outside (the heater 128), it is likely to be heated or cooled. Meanwhile, since the center portion of the wafer W is far from the outside of the wafer W, it is less likely to be heated or cooled. Therefore, in the process in which the setting temperature is decreased over time, the temperature is decreased in the vicinity of the edge of the wafer W earlier than in the vicinity of the center. As a result, the temperature in the center portion becomes relatively higher than that in the edge portion, and as illustrated in FIG. 6B, the concave shape of the film thickness distribution as illustrated in FIG. 5B is moderated, and thus, a flatter film thickness distribution is obtained (the in-plane uniformity of the film thickness in the wafer W is enhanced).

However, the in-plane film thickness of the wafer after film formation may not be uniform only by the process setting during the film formation. Accordingly, the concave shape of the film thickness distribution is alleviated as illustrated in FIG. 6B.

Here, as described above, the film 410 suffers from etching rate variation depending on the film formation temperature. Therefore, in a film forming processing at fixed temperatures expressed by the setting temperature profiles in FIG. 6A, the etching rate in the center portion of the wafer W becomes smaller as compared to the etching rate in the edge portion, as illustrated in FIG. 6C.

As a result, in the wafer W after etching, as illustrated in FIG. 6D, the depths of etching portions 420 (heights from the bottom surface of the base 400 in the bottom surface of the etching portions 420) may be the same in the center portion and the edge portion. That is, in the substrate processing method of the present exemplary embodiment, the in-plane film thickness distribution after etching the base 400 becomes uniform.

Figure 7A:
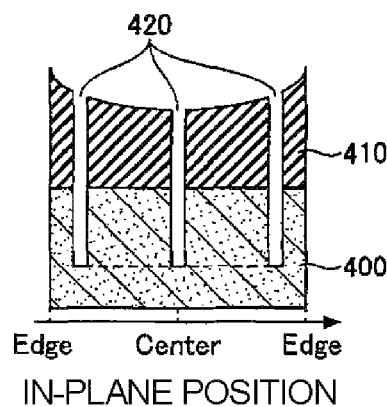
FIGS. 7A and 7B are schematic views for describing another exemplary substrate processing method according to the present exemplary embodiment.
Figure 7B:
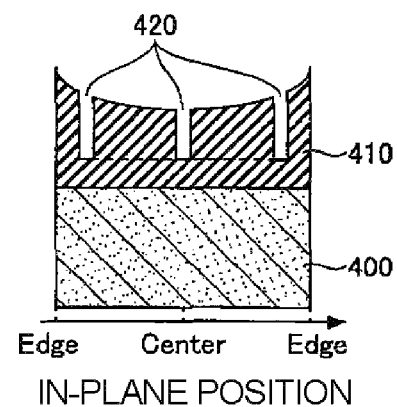

Further, in the exemplary embodiment as illustrated in FIGS. 6A to 6D, although description has been made on an exemplary embodiment in which the film 410 and the base 400 are etched by etching, the present disclosure is not limited to this exemplary embodiment. FIGS. 7A and 7B are schematic views for describing another exemplary substrate processing method according to the present exemplary embodiment. As illustrated in FIGS. 7A and 7B, the etching process of the present exemplary embodiment may also be applied to a process in which only a film 410 is etched.

When performing the substrate processing method according to the present exemplary embodiment, first, an operator inputs processing contents (e.g., formation of a silicon nitride film, a target film thickness of the wafer W, and a target etching rate of the wafer W) to the operation panel 148. The CPU 144 determines whether there is input or not. If there is input, the CPU 144 reads out a film formation recipe in response to the input instruction contents from the recipe storage unit 136.

Next, a target film formation temperature profile is calculated from the first process model configured to express an influence of the film formation temperature on the film formation amount and the second process model configured to express an influence of the film formation temperature on the etching rate, such that the in-plane distribution of the film thickness of the wafer after etching becomes uniform. In calculating the target film formation temperature profile, an optimization algorithm, such as linear programming or quadratic programming, is used to calculate a temperature satisfying the in-plane uniformity based on the film thickness stored in the read process recipe and the etching rate in the subsequent etching process.

Further, according to the thermal model stored in the model storage unit 134, the setting temperature profile (e.g. a profile of control signals to the power controller 130) is calculated such that the temperature of the wafer W follows the target film formation profile, and the recipe is updated. Further, the setting temperature profile includes a setting temperature profile in which a temperature is changed from a first temperature that is a film formation starting temperature to a second temperature that is a film formation ending temperature at a first time that is a film formation time.

Further, the temperature control is preferably performed for every zone. Accordingly, it is possible to perform a film forming processing which is excellent in inter-plane uniformity.

Next, the CPU 144 sets the temperature in the processing chamber 102 by the heater 128 based on the determined setting temperature profile, places a predetermined sheets (e.g., 150 sheets) of wafers W as workpieces in the wafer boat 126, and move up the cover 120 by the elevation mechanism 122. Then, the CPU 144 loads the wafers in the processing chamber 102 in a state where the inside of the processing chamber 102 is hermetically sealed.

When the loading of the wafers W is completed, the CPU 144 sets the inside of the processing chamber 102 under film forming conditions according to the recipe which has been read out. The film forming conditions includes, for example, a degree of opening of the opening variable valve 114. Then, the CPU 144 supplies a processing gas in a predetermined amount to the processing chamber 102 to perform the film forming processing.

Subsequently, the CPU 144 determines whether or not the film forming processing is completed. When the film forming processing is completed, the CPU 144 stops supplying the processing gas. Then, the CPU 144 cools the inside of the processing chamber 102, sets the temperature to an unload temperature determined in the recipe, and unloads the wafer boat 126.

Further, after unloading, a determining processing may be performed in which, among wafers W placed in the wafer boat 126, at least one wafer W is taken out from each of zones 1 to 5 and it is determined whether or not there is any problem with the film thickness of the film formed thereon.

The CPU 144 may store the calculated setting temperature profile as a setting temperature profile for the next film forming processing into the RAM 140, and update the recipe. Further, an operator may use the operation panel 148 to update the recipe setting the calculated setting temperature profile as a setting temperature profile for the next film forming processing.

The wafers W unloaded from the wafer boat 126 are provided for the next etching process. The wafers processed by the substrate processing method according to the present exemplary embodiment are subjected to a film forming processing with the setting temperature profile in consideration of the wafer etching rate. Therefore, the in-plane distribution of the film thickness of the wafers W after etching may be uniform just by etching the film uniformly as in a case of etching a flat film.

As described above, the substrate processing method and the substrate processing system according to the present exemplary embodiment perform a substrate processing method in accordance with a program in consideration of the film thickness in the film forming process and the etching rate in the etching process after the film forming process. Accordingly, the in-plane distribution of the film thicknesses of the wafers W after etching may be uniform without any manual adjustment by an operator.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   providing a substrate processing system comprising:
      a film forming apparatus including a processing chamber, and a cylindrical heater provided around an outer periphery of the processing chamber and divided into a plurality of zones including local heaters each being configured to independently control a heat generation amount, and configured to form a film on a workpiece, wherein the plurality of zones are arranged sequentially along the length of the cylindrical heater; and
      an etching apparatus separately provided from the film forming apparatus and configured to etch the film formed on the workpiece,
   setting, by the local heaters, temperatures for the plurality of zones of the cylindrical heater, respectively, such that a set temperature profile including increase or decrease of the respective temperatures of the plurality of zones of the cylindrical heater is determined;
   forming, by the film forming apparatus, the film on the workpiece using a processing gas in the processing chamber while decreasing the temperatures of the plurality of zones of the cylindrical heater over time, respectively, and at the same time, maintaining the temperatures of the plurality of zones of the cylindrical heater to be different from each other according to the set temperature profile such that a temperature in a center portion of the workpiece becomes relatively higher than that in an edge portion of the workpiece according to a distance between the cylindrical heater and the center portion of the workpiece, and a distance between the cylindrical heater and the edge portion of the workpiece; and
   after the forming the film, etching, by the etching apparatus, the film such that an etching rate in the center portion of the workpiece becomes relatively smaller than that in the edge portion of the workpiece,
   wherein a first difference of the etching rate between the center portion and the edge portion of the workpiece in the etching depends on a film formation temperature that is a temperature of the workpiece in the forming the film on the workpiece, and
   the set temperature profile is determined based on a first temperature dependence of the first difference of the etching rate between the center portion and the edge portion of the workpiece in the etching the film with respect to the film formation temperature, and a second temperature dependence of a second difference of a film formation amount between the center portion and the edge portion of the workpiece in the forming the film with respect to the film formation temperature.

2. The substrate processing method of claim 1, wherein the set temperature profile is determined with respect to the second difference of the film formation amount and the first difference of the etching rate that are predetermined based on a first process model, a second process model and a thermal model, and
   wherein the first process model expresses an influence of the film formation temperature on the second difference of the film formation amount, the second process model expresses an influence of the film formation temperature on the first difference of the etching rate, and the thermal model determines the set temperature profile such that a temperature in the processing chamber is set to be the film formation temperature determined from the first process model and the second process model.

3. The substrate processing method of claim 1, wherein the set temperature profile includes a set temperature profile that changes a temperature from a first temperature to a second temperature at a first time.

4. A non-transitory computer-readable recording medium storing a program that, when executed, causes the computer to perform the substrate processing method of claim 1.

5. A control apparatus of a film forming apparatus that forms a film on a workpiece,
   the film forming apparatus including a processing chamber and a cylindrical heater provided around an outer periphery of the processing chamber and divided into a plurality of zones each including a local heater configured to independently control a heat generation amount wherein the plurality of zones are arranged sequentially along the length of the cylindrical heater,
   the control apparatus comprising:
   a model storage unit including a first process model, a second process model, and a thermal model,
   wherein the control apparatus is configured to control the film forming apparatus to:
   set temperatures for the plurality of zones of the cylindrical heater, respectively, such that a set temperature profile including increase or decrease of the respective temperatures of the plurality of zones of the cylindrical heater is determined; and form the film on the workpiece while decreasing the temperatures of the plurality of zones of the cylindrical heater over time, respectively, and at the same time, maintaining the respective temperatures of the plurality of zones of the cylindrical heater to be different from each other according to the set temperature profile such that a temperature in a center portion of the workpiece becomes relatively higher than that in an edge portion of the workpiece according to a distance between the cylindrical heater and the center portion of the workpiece, and a distance between the cylindrical heater and the edge portion of the workpiece, and wherein the first process model expresses an influence of a film formation temperature that is a temperature of the workpiece when the film is formed on the workpiece on a second difference of a film formation amount between the center portion and the edge portion of the workpiece, the second process model expresses an influence of the film formation temperature on a first difference of an etching rate between the center portion and the edge portion of the workpiece, and the thermal model determines the set temperature profile such that a temperature in the processing chamber is set to be the film formation temperature determined from the first process model and the second process model.

6. A film forming apparatus comprising:

a processing chamber;

a cylindrical heater provided around an outer periphery of the processing chamber and divided into a plurality of zones each including a local heater configured to independently control a heat generation amount, wherein the plurality of zones are arranged sequentially along the length of the cylindrical heater; and a control unit configured to control the film forming apparatus and including a model storage unit that stores process models including a first process model, a second process model and a thermal model, and a CPU connected to the model storage unit and configured to calculate a film formation temperature that is a temperature of a workpiece when a film is formed on the workpiece by the film forming apparatus based on a desired film formation amount on the workpiece and a desired etching rate of the film after the film is formed that are based on a process recipe, and the process models stored in the model storage unit, wherein the control unit is further configured to:

set temperatures of the plurality of zones of the cylindrical heater, respectively, such that a set temperature profile including increase or decrease of the respective temperatures of the plurality of zones of the cylindrical heater is determined; and form the film on the workpiece using a processing gas in the processing chamber while decreasing the respective temperatures of the plurality of zones of the cylindrical heater over time, respectively, and at the same time, maintaining the respective temperatures of the plurality of zones of the cylindrical heater to be different from each other according to the set temperature profile such that a temperature in a center portion of the workpiece becomes relatively higher than that in an edge portion of the workpiece according to a distance between the cylindrical heater and the center portion of the workpiece, and a distance between the cylindrical heater and the edge portion of the workpiece, and wherein the first process model expresses an influence of the film formation temperature on a second difference of a film formation amount between the center portion and the edge portion of the workpiece, the second process model expresses an influence of the film formation temperature on a first difference of an etching rate between the center portion and the edge portion of the workpiece, and the thermal model determines the set temperature profile such that a temperature in the processing chamber is set to be the film formation temperature determined from the first process model and the second process model.

7. A substrate processing system comprising:

a film forming apparatus including a processing chamber, and a cylindrical heater provided around an outer periphery of the processing chamber and divided into a plurality of zones each including a local heater configured to independently control a heat generation amount, and configured to form a film on a workpiece, wherein the plurality of zones are arranged sequentially along the length of the cylindrical heater;

an etching apparatus separately provided from the film forming apparatus and including a mounting table configured to dispose the workpiece thereon, and a nozzle provided above the mounting table and configured to inject an etching liquid to the film formed on the workpiece; and a control unit configured to control the film forming apparatus and the etching apparatus, and including a model storage unit that stores process models including a first process model, a second process model and a thermal model, and a CPU connected to the model storage unit and configured to calculate a film formation temperature that is a temperature of a workpiece when a film is formed on the workpiece by the film forming apparatus based on a desired film formation amount on the workpiece and a desired etching rate of the film after the film is formed that are based on a process recipe, and the process models stored in the model storage unit, wherein the control unit is further configured to:

set temperatures of the plurality of zones of the cylindrical heater, respectively, such that a set temperature profile including increase or decrease of the respective temperatures of the plurality of zones of the cylindrical heater is determined;

form the film on the workpiece using a processing gas in the processing chamber while decreasing the respective temperatures of the plurality of zones of the cylindrical heater over time, respectively and at the same time, maintaining the respective temperatures of the plurality of zones of the cylindrical heater to be different from each other according to the set temperature profile such that a temperature in a center portion of the workpiece becomes relatively higher than that in an edge portion of the workpiece according to a distance between the cylindrical heater and the center portion of the workpiece, and a distance between the cylindrical heater and the edge portion of the workpiece; and etch the film such that an etching rate in the center portion of the workpiece becomes relatively smaller than that in the edge portion of the workpiece, a first difference of the etching rate between the center portion and the edge portion of the workpiece when the film formed on the workpiece is etched depending on a film formation temperature that is a temperature of the workpiece when the film is formed on the workpiece, and the control unit is further configured to determine the set temperature profile based on a first temperature dependence of a first difference of the etching rate between the center portion and the edge portion of the workpiece when the film formed on the workpiece is etched with respect to the film formation temperature, and a second temperature dependence of a second difference of a film formation amount between the center portion and the edge portion of the workpiece when the film is formed on the workpiece with respect to the film formation temperature.

8. The substrate processing system of claim 7,
wherein the first process model expresses an influence of the film formation temperature on the second difference of the film formation amount,
the second process model expresses an influence of the film formation temperature on the first difference of the etching rate, and
the thermal model determines the setting temperature profile such that a temperature in the processing chamber is set to be the film formation temperature determined from the first process model and the second process model.

* * * * *